US006992002B2

(12) United States Patent
Dunham et al.

(10) Patent No.: US 6,992,002 B2
(45) Date of Patent: Jan. 31, 2006

(54) SHAPES-BASED MIGRATION OF ALUMINUM DESIGNS TO COPPER DAMASCENCE

(75) Inventors: Timothy G. Dunham, South Burlington, VT (US); Ezra D. B. Hall, Colchester, VT (US); Howard S. Landis, Underhill, VT (US); Mark A. Lavin, Katonah, NY (US); William C. Leipold, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 10/305,644

(22) Filed: Nov. 26, 2002

(65) Prior Publication Data

US 2003/0080435 A1 May 1, 2003

Related U.S. Application Data

(62) Division of application No. 09/670,411, filed on Sep. 26, 2000, now Pat. No. 6,528,883.

(51) Int. Cl.
H01L 21/4763 (2006.01)

(52) U.S. Cl. .................. 438/622; 438/631; 438/633; 438/637

(58) Field of Classification Search ................ 438/618, 438/622, 625, 626, 629, 631, 633, 637, 638, 438/642, 645, 675, 687, 688
See application file for complete search history.

(56) References Cited

U.S. PATENT DOCUMENTS

| 5,101,261 A | * | 3/1992 | Maeda ........................ 257/734 |
|---|---|---|---|
| 5,459,093 A | | 10/1995 | Kuroda et al. |
| 5,470,788 A | | 11/1995 | Biery et al. |
| 5,494,853 A | | 2/1996 | Lur |
| 5,556,805 A | | 9/1996 | Tanizawa et al. |
| 5,610,831 A | | 3/1997 | Matsumoto |
| 5,620,916 A | | 4/1997 | Eden et al. |
| 5,633,198 A | * | 5/1997 | Lur et al. .................... 438/618 |
| 5,759,906 A | | 6/1998 | Lou |
| 5,770,518 A | | 6/1998 | Shen |
| 5,811,352 A | | 9/1998 | Numata et al. |
| 5,861,342 A | * | 1/1999 | Gabriel et al. ............... 438/631 |
| 5,888,897 A | * | 3/1999 | Liang ......................... 438/622 |
| 5,899,706 A | | 5/1999 | Kluwe et al. |
| 5,915,203 A | | 6/1999 | Sengupta et al. |
| 5,923,563 A | * | 7/1999 | Lavin et al. .................. 716/19 |
| 5,930,668 A | | 7/1999 | Gardner |
| 5,956,618 A | | 9/1999 | Liu et al. |
| 5,963,831 A | | 10/1999 | Fu |
| 5,970,376 A | | 10/1999 | Chen |
| 5,981,376 A | | 11/1999 | Komatsu et al. |
| 5,981,384 A | | 11/1999 | Juengling |

(Continued)

FOREIGN PATENT DOCUMENTS

EP 744633 A2 * 11/1996

Primary Examiner—Tom Thomas
Assistant Examiner—N. Drew Richards
(74) Attorney, Agent, or Firm—Schmeiser, Olsen & Watts; William H. Steinberg

(57) ABSTRACT

An interconnect structure for use in semiconductor devices which interconnects a plurality of dissimilar metal wiring layers, which are connected vias, by incorporating shaped voids in the metal layers. The invention also discloses a method by which such structures are constructed.

3 Claims, 10 Drawing Sheets

U.S. PATENT DOCUMENTS

| | | |
|---|---|---|
| 6,022,804 A | 2/2000 | Yano et al. |
| 6,093,633 A * | 7/2000 | Matsumoto ................ 438/622 |
| 6,100,589 A | 8/2000 | Tanaka |
| 6,323,113 B1 * | 11/2001 | Gabriel et al. .............. 438/584 |
| 6,624,063 B2 * | 9/2003 | Hasegawa et al. .......... 438/623 |

* cited by examiner

SHAPES-BASED MIGRATION OF ALUMINUM DESIGNS TO COPPER DAMASCENCE

This application is a divisional of Ser. No. 09/670,411; filed on Sep. 26, 2000 now U.S. Pat. No. 6,528,883.

BACKGROUND OF THE INVENTION

1. Technical Field

The present invention relates generally to the field of semiconductor device formation, and more specifically to structures which interconnect a plurality of metal wiring layers by incorporating dummy shapes and voids therein, as well as to the method by which such structures may be manufactured.

2. Related Art

Copper damascene (i.e., etching) processes are incompatible with some aspects of industry standard aluminum-based design layouts. Specifically, wide metal lines, wide regions devoid of metal wires (i.e., "whitespace"), local regions of high metal-pattern-density, and local regions of low metal-pattern-density are all incompatible with state of the art in copper damascene processing. Consequently, the interconnect levels of semiconductor designs must be redrawn in order to accommodate the aforementioned limitations of damascene copper, specifically by following maximum-line-width rules, wide-line/wide-space rules, and local metal-pattern-density rules. These constraints on interconnect layouts are a significant obstacle to the utilization of damascene copper processes.

The related art generally uses one of two methods to produce a connection between areas of high via concentration (i.e., "via farms") and copper damascene layers in a semiconductor device. These two methods differ in their respective approaches to existing via farms. The first method does not allow any via farms, while the second method rebuilds most or all of the via farms.

In the first method, via farms are not allowed. Instead, only a single row of vias is allowed around the perimeter of the intersection of wide metal lines. This approach requires that industry-standardized designs be manually adjusted to remove "farm" vias, and subsequently retimed because the total via resistance for a large farm can be much less than the total via resistance for a single ring of vias along the perimeter.

The second method requires the rebuilding of all via farms. A design tool may be applied to the semiconductor device design. The design tool, such as those known in the art, may identify intersections of wide metal connected by vias, remove all vias from the intersection, and replace the vias in a preferred configuration (e.g., a single or double row at the perimeter of the intersection). However, there are two major drawbacks with this method. First, a large proportion of the via shapes are removed from any large via farm. Second, the design data is altered. Removing and replacing a large number of via shapes can have an unpredictable effect, both on the run-time, and on the results of subsequent verification procedures such as Design Rule Checking (DRC) and Logical Versus Schematic (LVS) checking.

SUMMARY OF THE INVENTION

The invention disclosed herein presents a process and related structures that allow migration of industry-standard aluminum-based layouts to copper damascene, based solely on shapes-information (i.e., no net-list analysis is required). This method and its attendant structures have the added property of leaving all the customer's design shapes unaltered. Fill shapes for metal layer "x" (MxFILL) and hole shapes for metal layer "x" (MxHOLE) are added to the design (where "x" denotes the number of a layer), but the customer's shapes and the hierarchy of the customer's design are left unaltered.

Specifically, metal fill shapes (i.e., small electrically-isolated "dummy" metal shapes that are placed in otherwise empty regions), and metal hole shapes (i.e., small isolated "holes" that are cut from the interior of wide metal lines) are used to satisfy all of the copper damascene-specific ground rules.

By judicious choice of the size and placement of these fill and hole shapes, it is possible to make their addition virtually transparent to the customer's design. That is,-the electrical behavior of a design utilizing both metal fill and metal hole shapes can be made to behave in a manner entirely consistent with modeled electrical behavior of the design without regard to the specific placement of fill and hole shapes.

The present invention provides a method to produce a connection between via farms and copper damascene layers in a semiconductor device by initially deriving via farms, and next allowing MxHOLE shapes to be placed on the interior of via farms without regard to the exact location of the vias located there.

The present invention can be fully automated, is entirely shapes-based (i.e., does not require net-list building), leaves the customer's design data unaltered (only adding shapes to MxFILL and MxHOLE), and preserves the majority of the via and hole area within the interior of so-defined via farms. This approach transparently accommodates a wide variety of via farm layouts, and by construction satisfies the via electromigration requirements for wide copper lines. Furthermore, because a "typical" via is at the end of a minimum-width wire, and contacts the end of another minimum-width wire below, the nominal via resistance is quite high, and the tolerance, particularly for high resistance is very large. Most of the factors that tend to increase the resistance of a typical via are not applicable to a via which is fully landed in a wide metal layer. Indeed, the specified nominal resistance of a via farm will generally be much greater than the measured resistance of the via farm, even with a fraction of the interior vias landing on metal holes.

The present invention provides an electronic circuit comprising: a semiconductor substrate; a dielectric material such as oxide positioned on said semiconductor substrate, said dielectric having at least one cavity therein; a metal layer positioned on said semiconductor substrate within said at least one cavity; and a plurality of cavities within said metal layer, each cavity or cavities having a layer of said dielectric material positioned therein.

The present invention additionally provides an electronic circuit comprising: a semiconductor substrate; a first metal conductor on said semiconductor substrate; a second metal conductor on said semiconductor substrate; and a plurality of metal forms on said first and said second metal conductors, said plurality of metal forms insulated from said first and second metal conductors.

The present invention also provides a method of manufacturing a semiconductor device comprising: providing at least two metal layers over a substrate, the metal layers being isolated from each other by an insulating layer and forming a contact/via within the dielectric layer to electrically connect at least two of the metal layers, wherein a contact/via array comprises a plurality of contact/via columns and a plurality of contact/via rows made up of a plurality of contacts/vias; generating hole and fill information for a preferred design; creating a metal fill shapes pattern; creating a metal hole shapes pattern; verifying a resultant design which incorporates the metal fill shapes pattern and the metal hole shapes pattern; verifying the compatibility of original design data for the semiconductor device with the resultant design.

DETAILED DESCRIPTION OF THE INVENTION

Prior to the first step in the method of the invention, the desired design is assembled using industry-standard layout tools and practices.

Figure 10:
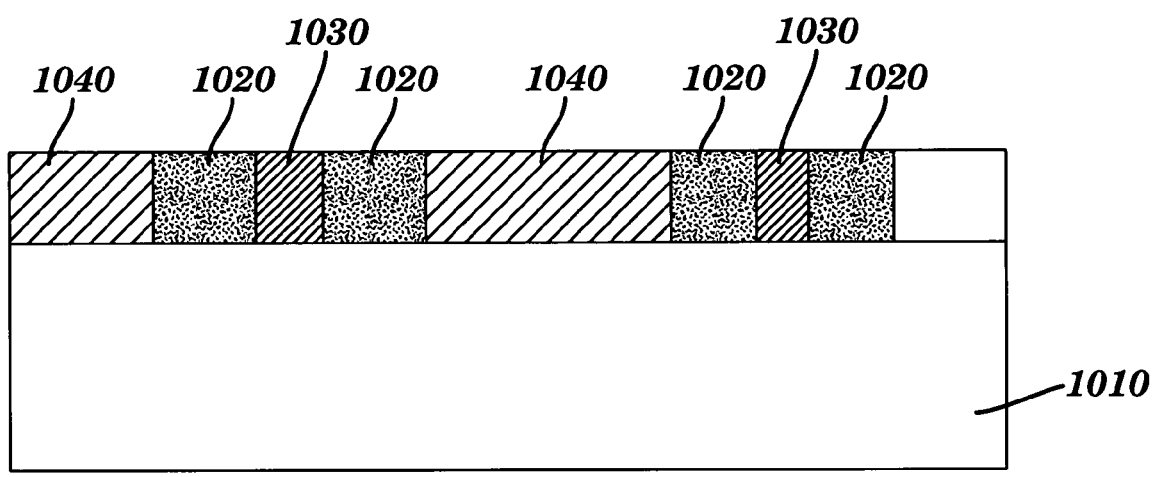
FIG. 10 is a cross-sectional diagram of an embodiment of the present invention.

The invention is performed on a semiconductor design as rendered in FIG. 10 which includes a substrate 1010, typically silicon, upon which is a dielectric layer 1040. Formed within the dielectric layer 1040 are metal (e.g., copper) layers 1020 and dielectric pedestals 1030.

Figure 7:
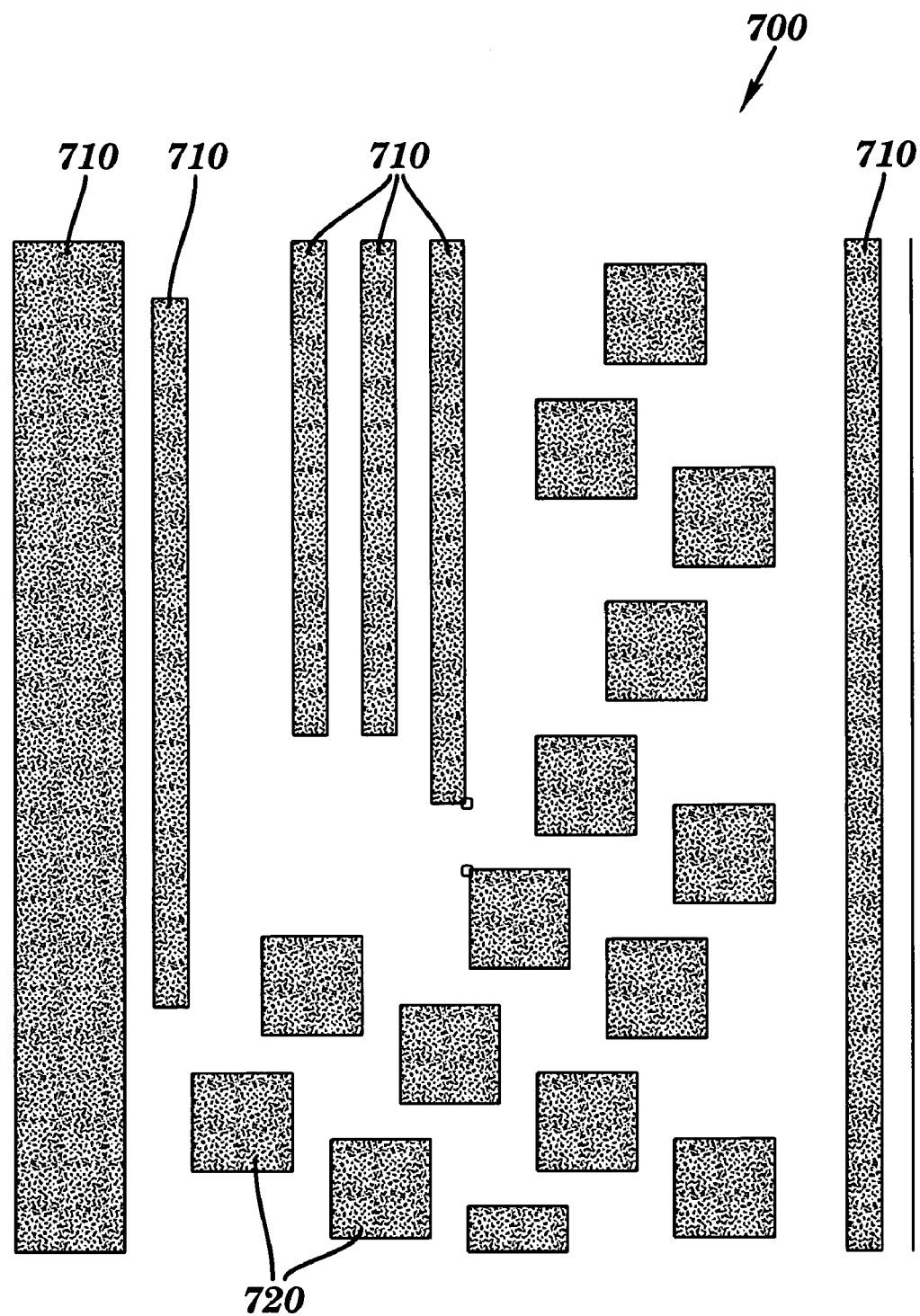
FIG. 7 is a plan view of a typical MxFILL pattern, size and grid wherein "real" metal shapes are included for reference.
Figure 9:
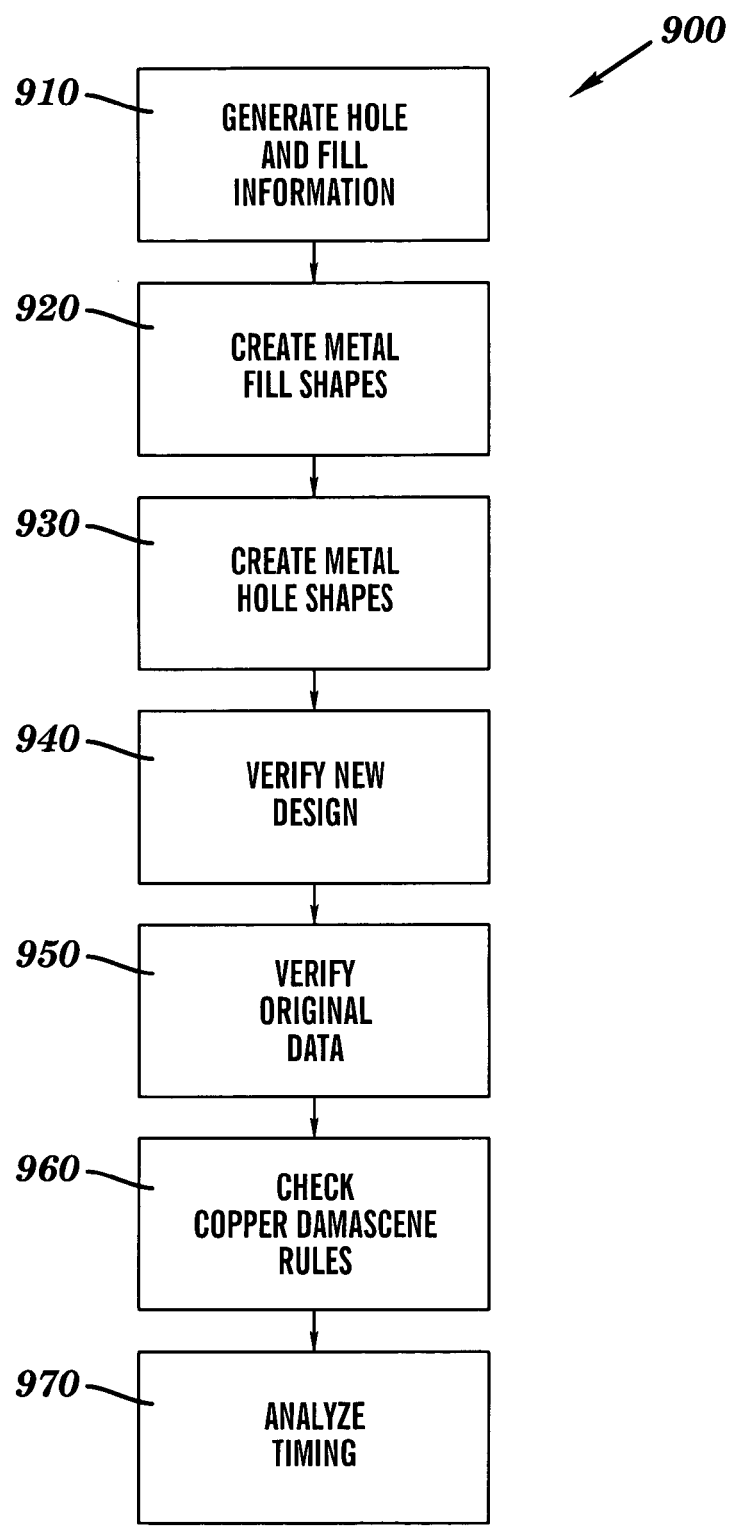
FIG. 9 is a flow chart of the method of the present invention.

Referring to FIG. 9, the method of the present invention begins with the group of steps comprising the generation 910 of hole and fill information. Initially, it is necessary to identify regions from which metal fill and/or metal hole shapes must be excluded These include identification of logo regions and fuse bays (identified as openings in the final passivation that are not covered by metal). An embodiment of this step is illustrated in FIG. 7.

Next, metal fill shapes are created 920 for each metal level. Metal fill shapes are placed wherever there is enough empty space on a given metal level to accommodate them. Metal fill shapes are generally kept at least as far away from "real" metal shapes on that level as the standard minimum space that has been defined for that metal layer. Regions of whitespace (i.e., wide regions devoid of metal wires) that could possibly accommodate metal fill shapes are located by expanding all metal shapes by the Mx/MxFILL set-back per edge (i.e., at least standard minimum space for that level), and taking the complement of the unioned result. Metal fill shapes of a preferred size are then placed within the "region-to-be-filled" complement shapes, on a specified pattern or grid. If a metal fill shape does not fit entirely within the allotted region-to-be-filled, it is discarded entirely. That is, only whole MxFILL shapes are retained. The preferred shape for MxFILL is a square that is three-times the minimum-width, and the preferred layout pattern is an offset-grid with a pitch equal to twice the Mx minimum space. Using this fill size and pattern, the maximum local MxFill-pattern-density in a region of fill is the preferred value of about 45%.

Figure 8:
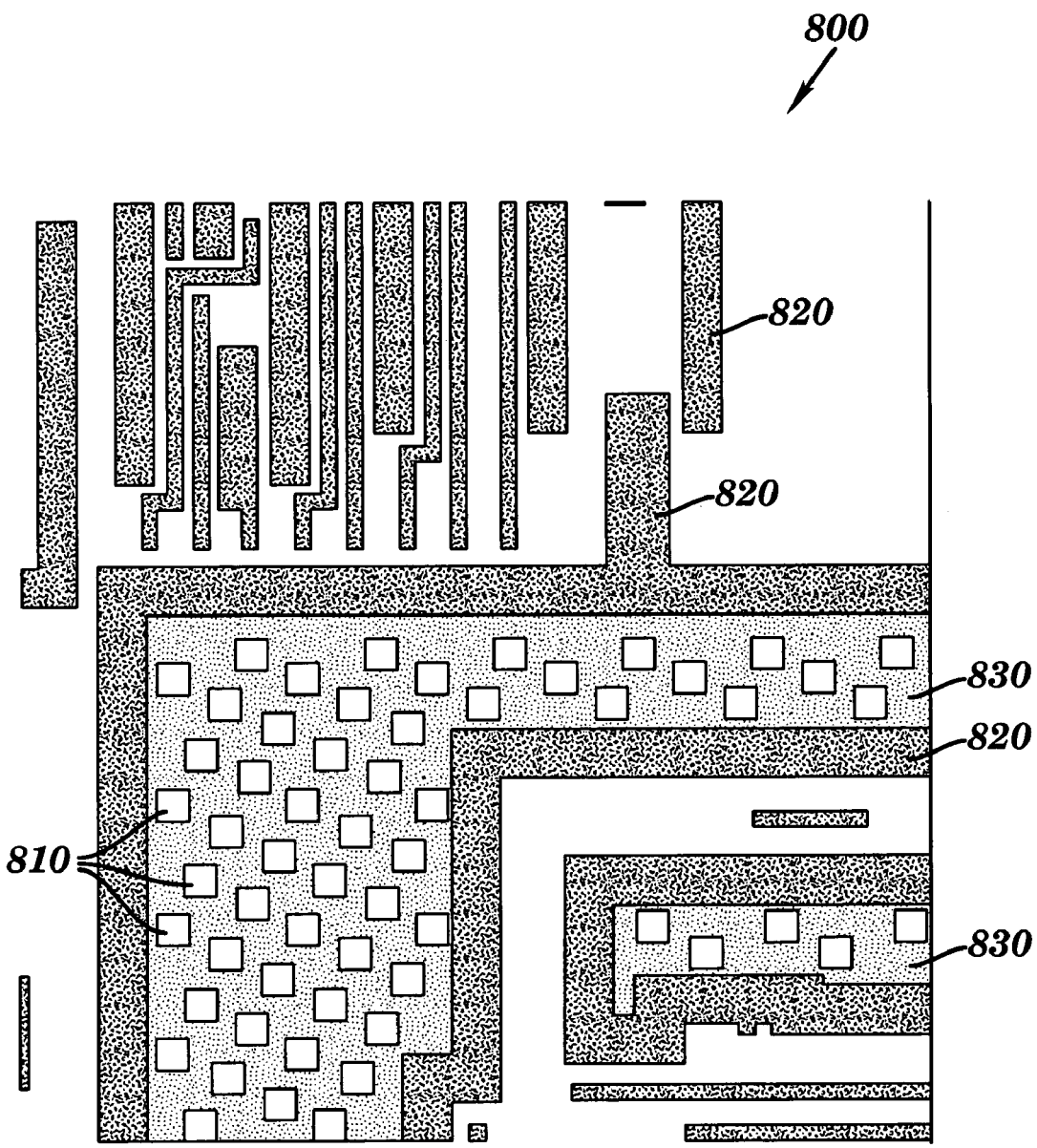
FIG. 8 is a plan view of a typical MxHOLE pattern, depicting a preferred size and grid.

In the next step, metal hole shapes are created 930 for each metal level. Metal hole shapes are placed in the interior of all wide lines where there is sufficient room to accommodate them. Metal hole shapes are generally kept at least as far away from the inside edge of metal lines as standard minimum linewidth for that metal level. Further, metal hole shapes are kept at least as far away from non-redundant vias (on the via levels directly above or directly below the metal level of interest) as required by standard via-coverage rules. Regions of wide metal that could possibly accommodate metal fill shapes are located by shrinking all metal shapes by the Mx/MxHOLE set-in per edge (i.e., at least the standard minimum line width for that level), and subtracting from those shapes the non-redundant via shapes (expanded by the Via/MxHOLE set-back per edge). Metal hole shapes of a preferred size are then placed within the resulting "region-to-be-cheesed" shapes, on a specified pattern or grid. If a metal hole shape does not fit entirely within the allotted region-to-be-cheesed, it is discarded entirely. That is, only whole MxHOLE shapes are retained. One shape for MxHOLE is a square that is two-times the minimum-space (i.e., per edge); and the preferred layout pattern is an offset-grid with a pitch equal to twice the Mx minimum space. Using this hole size and pattern, the maximum local metal-pattern-density in a region containing shapes is 80%; or equivalently the maximum MxHOLE density is 20%. An embodiment of this step is illustrated in FIG. 8.

Once these steps are completed, all generated fill and hole shapes are collected. This collection is then merged with original design data. This step is performed by standard shapes-processing means and tools, as are well known in the art.

Figure 4:
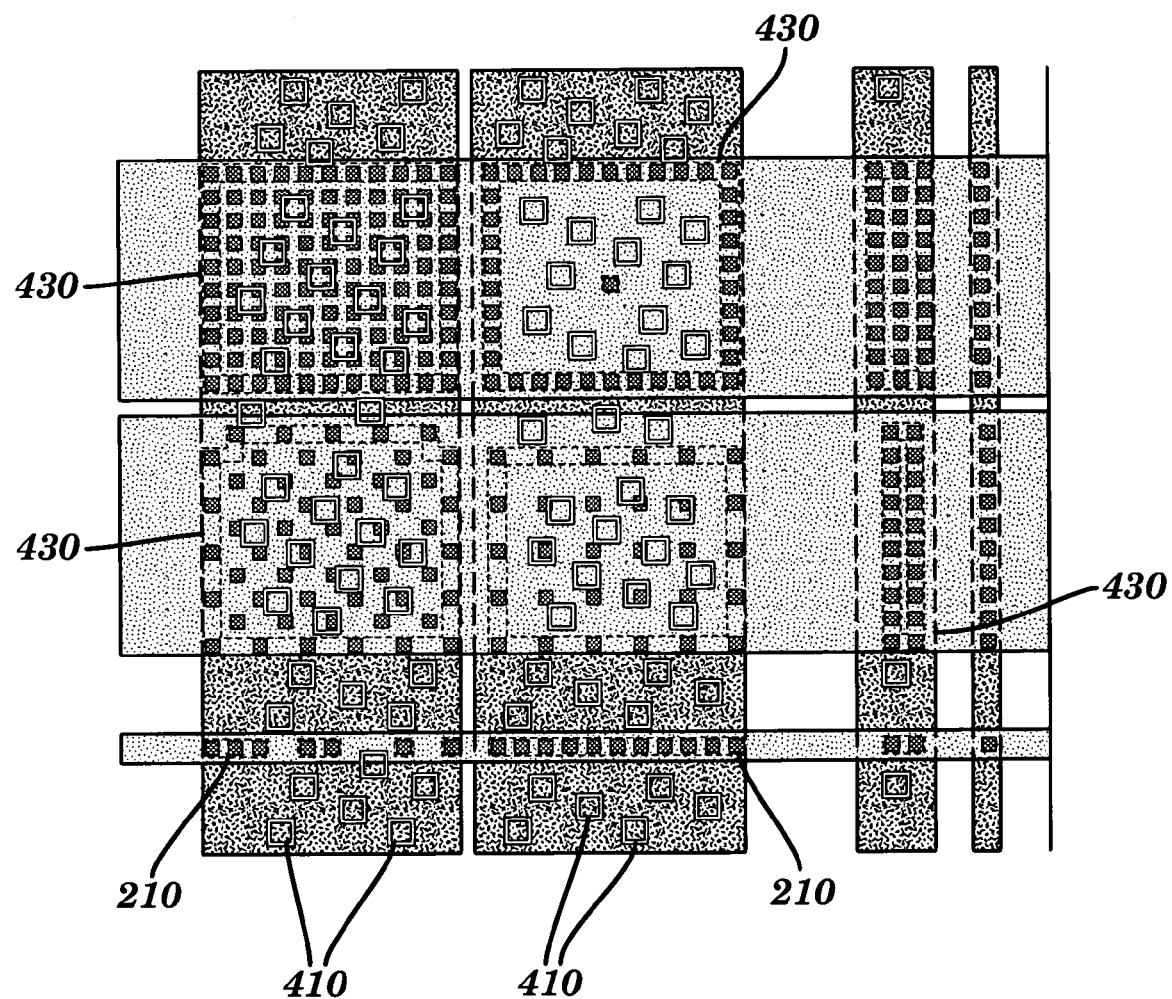
FIG. 4 is a plan view of two metal layers and a via layer depicting M1HOLE shapes which must avoid V1_Block_M1 and must avoid the perimeter of V1FARM.

The group of steps comprising design verification 940 are performed next. First, the construction of generated fill and hole shapes is done using standard Design-Rule-Checking (DRC) tools to verify that the following prescribed values are observed: MXFILL outside Mx; MxFILL outside MxEXCLUD (e.g., logos, fuse bays); MXHOLE inside Mx; MXHOLE outside Vx, Vx–1; MxHOLE outside MxCHEXCL, where for example, "M1FILL outside M1" refers to a rule requiring that all M1FILL shapes must lie outside any M1 shape by at least a prescribed minimum distance. Similarly, "M2HOLE inside M2" refers to a rule requiring that all M2HOLE shapes are entirely inside M2 by at least a prescribed minimum distance. An embodiment of this step is illustrated in FIG. 4.

Next, checking of the integrity of the original data levels is performed 950 using Logical-versus-Schematic (LVS) tools to repeat the verification of the data levels present in the original design, including everything except the generated MxFILL and MxHOLE.

Figure 5:
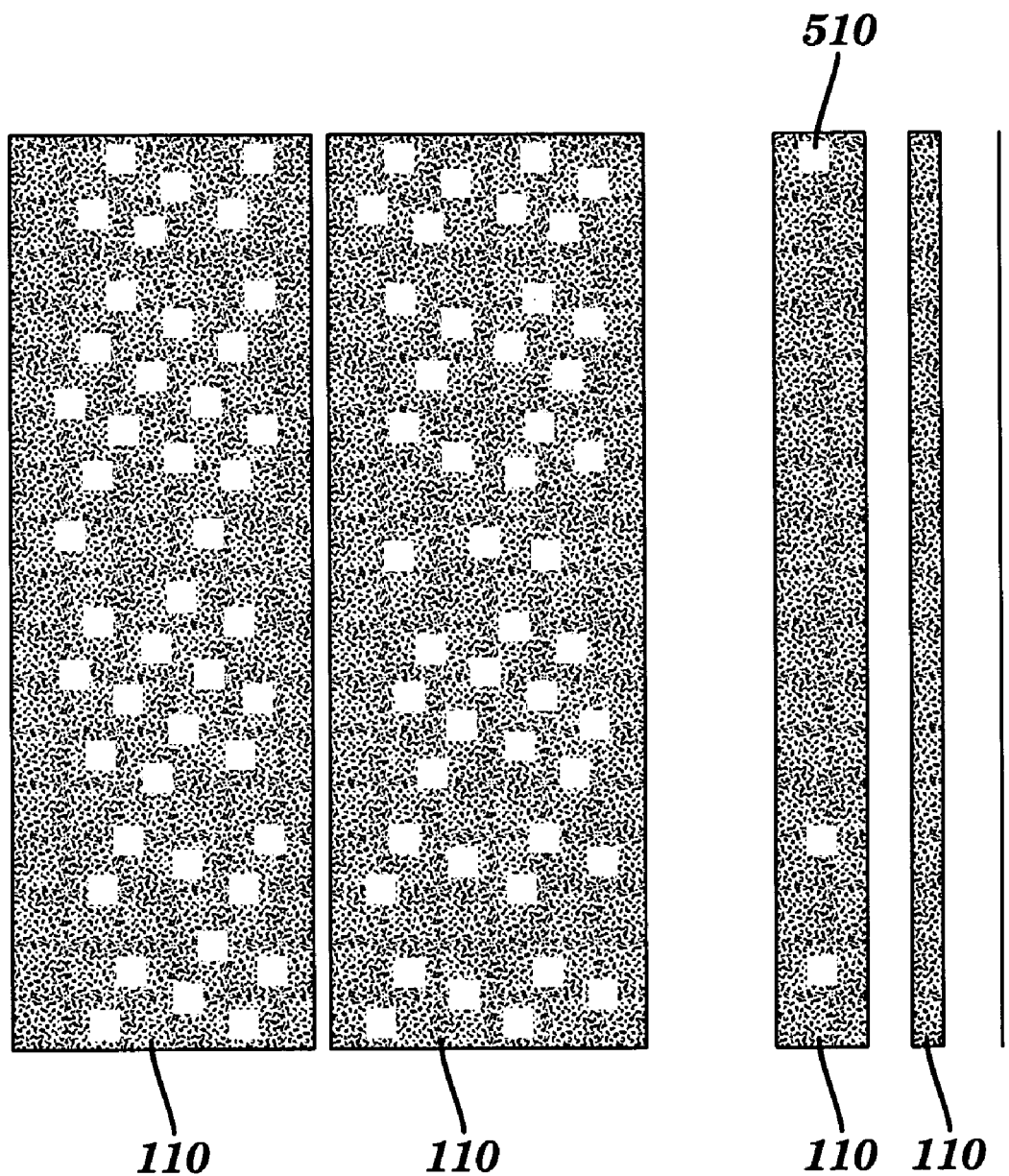
FIG. 5 is a plan view of two metal layers and a via layer depicting the resulting M1 layer , with M1HOLE shapes resolved.

Then, a check may be performed 960 to ensure that the resulting metal satisfies copper damascene rules. Using standard DRC tools, it can be verified that the wide-line/wide-space and local-metal-pattern-density rules are observed (or can be waived) for the resolved metal, where Metal=Mx+MxFILL−MxHOLE. An embodiment of this step is illustrated in FIG. 5.

The next step 970 is to optionally analyze the timing of the modified layout design. This step is not required in all cases, since in general, electrical perturbations due to FILL and HOLE shapes are modest and predictable. Thus, timing adjustments are not generally needed after MxFILL and MXHOLE generation.

In those applications where it is necessary to analyze the timing, it should be noted that metal fill shapes, as described herein, are virtually transparent to the circuit. In virtually all cases, the change in capacitance of a signal wire due to the presence or absence of nearby metal fill is very much smaller than the capacitance changes associated with the specified process tolerances for CMOS technologies. In general, metal fill shapes do not effect the timing of a design.

Metal hole shapes, as described above, do not affect the resistance of narrow lines. Narrow lines are defined as too small to receive HOLE shapes, typically less than six times the minimum linewidth. Wide lines are defined as wide enough to possibly receive HOLE shapes, typically, six times the minimum linewidth. Since most timing tools are not able to accommodate either a linewidth-dependent sheet resistance, or a pattern-density-dependent sheet resistance (Rs), a designer must choose a single value for the Rs of all the wires, regardless of their width. The standard choice is the Rs for minimum width wires, as those minimum-width wires make up the vast majority of interconnects in a standard design. For these designs, the presence or absence of MxHOLE shapes does not affect any of the parameters used in timing analyses. Similarly, pattern-density, linewidth and nested/isolated effects on Rs are normally ignored. For those designers with more sophisticated timing tools, the effects of MXHOLE shapes can be modeled as a linewidth-dependence on Rs or, more practically, as a linewidth-dependent etch bias. These dependencies are normally known well in advance, and anticipated in the initial circuit timings, thus obviating the need for retiming analysis after MxHOLE generation.

Figure 1:
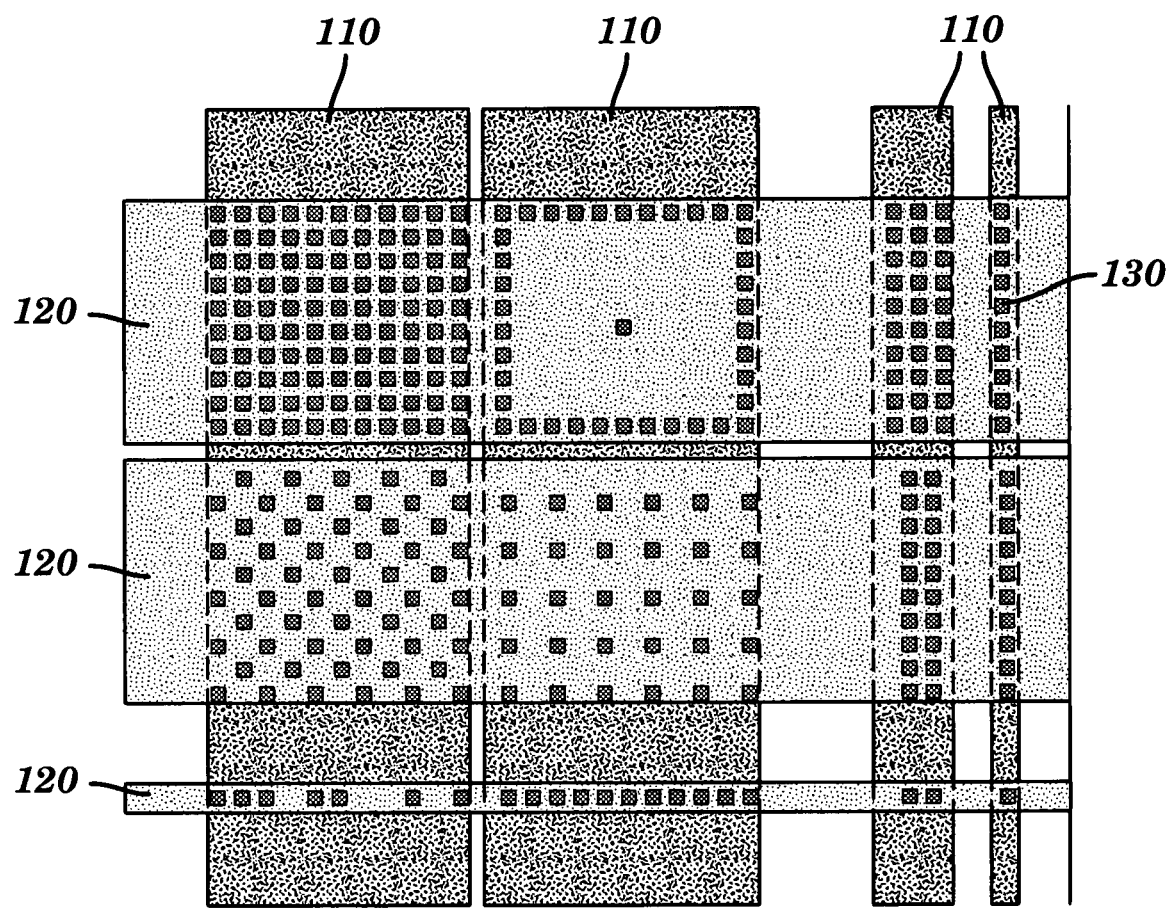
FIG. 1 is a plan view of two metal layers and a via layer.

Referring now to FIG. 1, an initial embodiment of the structure and steps of the invention is presented. Regions 110 represent metal lines of a first layer M1. Regions 120 represent metal lines of a second layer M2 which is distinct and electrically isolated from M1, except where electrical connection is made between M1 and M2 by V1 vias 130.

Figure 2:
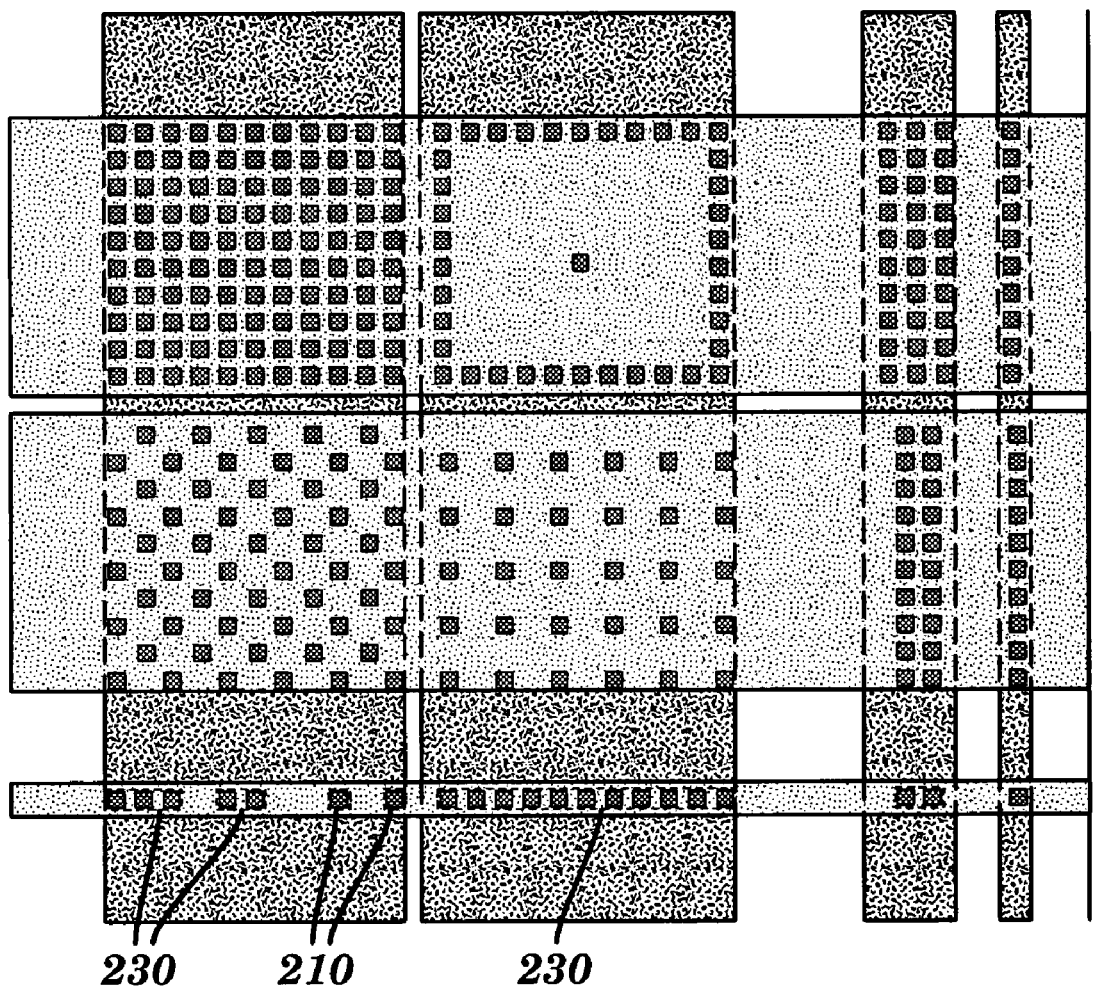
FIG. 2 is a plan view of two metal layers and a via layer wherein there are V1BlockM1 shapes.

Referring now to FIG. 2, via blockages 210 are identified and illustrated as new levels such as V1BlockM1, V1BlockM2.

For each via level, all vias that contact wide metal above, or wide metal below (but not both) are identified.

N.B. For the sake of this disclosure, "wide metal" is defined as any metal structure wide enough in its minor dimension to possibly accommodate a metal hole shape: For standard metal hole parameters (preferred dimensions and layout grid), a line is "wide" if it is at least six times the minimum linewidth for the metal level in question.

Also shown in FIG. 2 is the result of an optional step of combining adjacent vias, which results in combined vias 230. For each via level, for the set of vias that contacts wide metal only above, and separately for the set of vias that contacts wide metal only below, expand and then shrink those via shapes by the VxBlockage Spacing, per edge. Then union the result, to simplify overlapping and abutting shapes. This has the effect of representing a row of vias with their least enclosing rectangle, which can greatly improve the computational efficiency of later steps. The preferred value for VxBlockageSpacing is (2*MxHole_setback_from_Vx+MxHole_size)/2, which is approximately equal to the via size, assuming preferred values for MxHOLE_setback_from_Vx and MxHOLE_size. In any case, the smallest useful value for VxFarmSpacing (i.e., a distance characterizing the largest spacing between vias in a redundant via) is one-half of the via minimum space.

Figure 3:
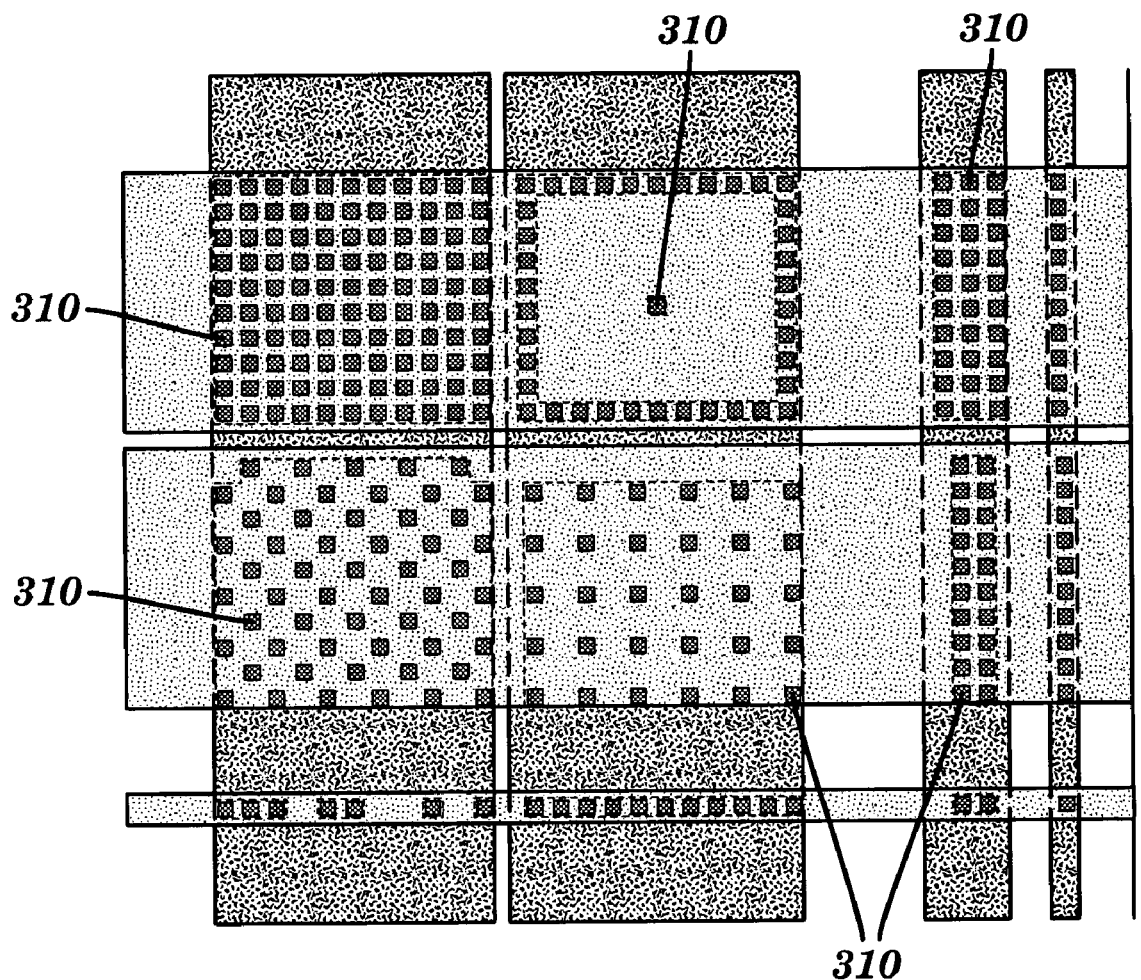
FIG. 3 is a plan view of two metal layers and a via layer wherein there are V1Farm shapes.

Referring to FIG. 3, via farms are identified and new levels such as V1Farm 310 are defined by the least enclosing polygon of the via form. That is, for each via level, identify all vias that contact wide metal above and wide metal below. Potential VxFarms are identified as vias that contact both. For each via level, for the set of vias that contacts both wide metal above and below, expand and then shrink those via shapes by the VxFarmSpacing, per edge. For the MxHOLE layout grid, one value for VxFarmSpacing is (3*MxHOLE-pitch−MxHOLE_size)/2, or two times the Mx minimum linewidth (which is typically equal to the HOLE size), assuming preferred values for MxHOLE_size and MxHOLE_pitch. In any case, the smallest useful value for VxFarm Spacing is one-half of the via minimum spacing.

Next, actual via farms are identified. For each potential via farm shape, intersect those shapes with wide metal above and with wide metal below. Each resulting shape completely covers the collection of tightly-spaced redundant vias connecting a single piece of wide metal above with a single piece of wide metal below.

Then place MxHOLE shapes (e.g., M1HOLE 410), avoiding via blockage shapes (e.g., V1BlockM1 210), and avoiding vias in the perimeter of via farm 430 shapes.

During manufacture, the intersection of a Vx shape with a MxHOLE shape (on the metal level below) is not resolved as an electrical connection between the two metal levels. That is, the intersection is not useful as a via (it does not connect to Mx+1). The intersection of a via with a metal hole shape in the level above may resolve as an electrical connection, depending on the process. In either case, no unusual defect or reliability issues result from any possible intersection of vias in a via farm with hole shapes in wide metal above or below.

If the MxHOLE local density is small (e.g., about 20%), then only a small fraction of the area of the vias 130 will be lost from the interior of a normally-constructed via farm 430. In general, only 25% or less of the hole area on level Mx can be lost due to interactions with vias in the interior of a via farm.

FIG. 5 depicts a resulting M1 metal layer 110 wherein the M1HOLE shapes 510 are resolved.

Figure 6:
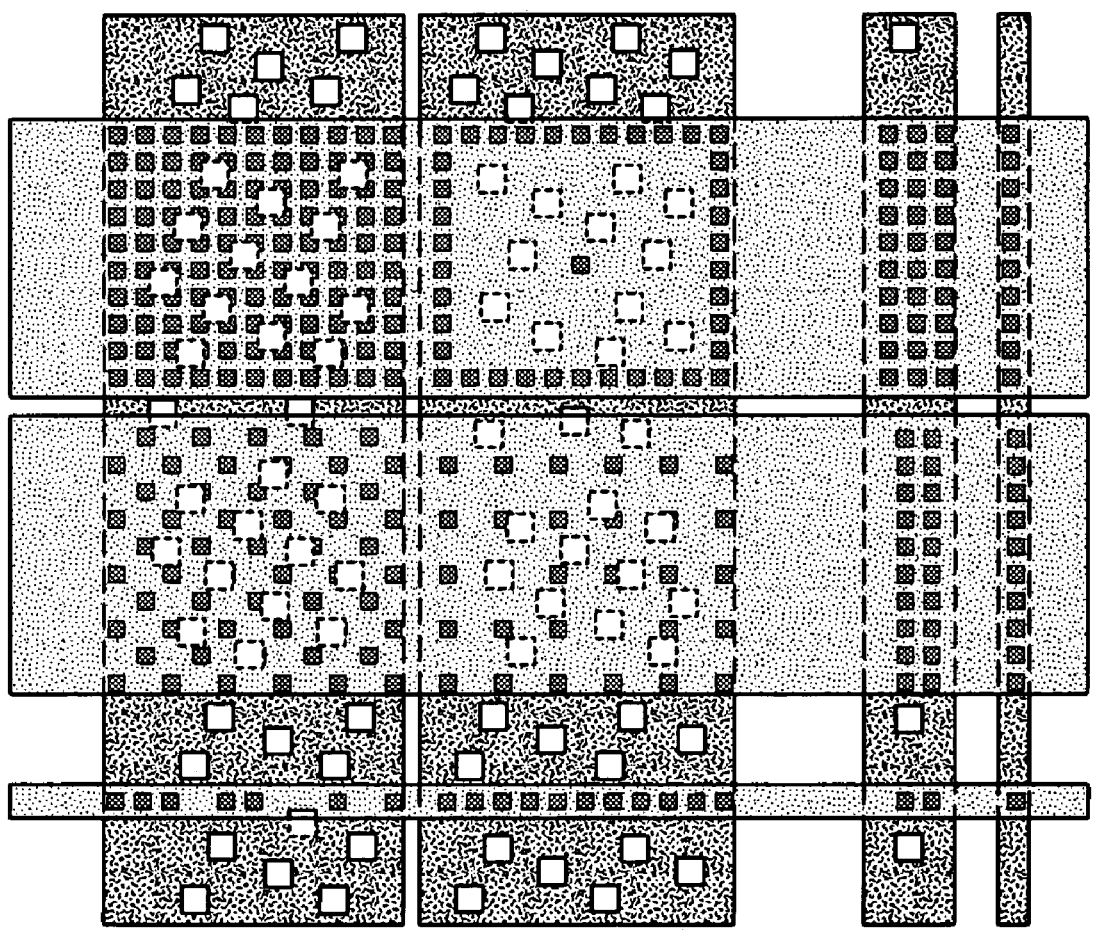
FIG. 6 is a plan view for the preferred MxHOLE size and layout.

FIG. 6 illustrates that for the MxHOLE size and layout (resulting in 20% maximum local MxHOLE density), a typical via farm will lose 20% of the via area from the interior of a via farm. Up to 25% of the MxHOLE density will be lost, depending on the local via density.

FIG. 7 shows a typical MxFILL pattern 720 of one size and grid. "Real" metal shapes 710 are included for reference.

FIG. 8 depicts a typical MxHOLE pattern 810 of a typical size and grid. Mx shapes 820 and "region-to-be-cheesed" shapes 830 are included for reference.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of manufacturing an electronic circuit, comprising:

providing a semiconductor substrate;

forming an oxide of said semiconductor substrate positioned on said semiconductor substrate, said oxide having at least one cavity therein exposing a portion of said semiconductor substrate;

forming a metal layer positioned on said semiconductor substrate within said at least one cavity, said metal layer including a plurality of metal fill shapes, said metal fill shapes arranged in a first layout pattern; and forming a plurality of metal hole shapes within said metal layers each metal hole shape having a layer of said oxide of said substrate positioned therein, said metal hole shapes arranged in a second layout pattern, wherein said second layout pattern is an offset-grid, said offset-grid having a pitch defined by a linewidth of the metal layer.

2. The method of claim 1, wherein the metal layer is selected from the group consisting of copper and copper alloy.

3. The method of claim 1, wherein the metal layer is selected from the group consisting of aluminum and aluminum alloy.

* * * * *